(12) United States Patent
Rumiantsev et al.

(10) Patent No.: US 7,769,555 B2
(45) Date of Patent: Aug. 3, 2010

(54) METHOD FOR CALIBRATION OF A VECTORIAL NETWORK ANALYZER

(75) Inventors: Andrej Rumiantsev, Dresden (DE); Steffen Schott, Dresden (DE); Stojan Kanev, Thiendorf OT Sacka (DE)

(73) Assignee: SUSS Microtec Test Systems GmbH, Sacka (DE)

( * ) Notice: Subject to any disclaimer, the term of this patent is extended or adjusted under 35 U.S.C. 154(b) by 428 days.

(21) Appl. No.: 11/942,091

(22) Filed: Nov. 19, 2007

(65) Prior Publication Data

US 2008/0125999 A1 May 29, 2008

(30) Foreign Application Priority Data

Nov. 27, 2006 (DE) ...................... 10 2006 056 191

(51) Int. Cl.
*G01D 18/00* (2006.01)
(52) U.S. Cl. ...................................... 702/90
(58) Field of Classification Search ................ 702/90, 702/107; 324/601

See application file for complete search history.

(56) References Cited

U.S. PATENT DOCUMENTS 7,130,756 B2 10/2006 Heuermann
2004/0246004 A1* 12/2004 Heuermann ................. 324/601

* cited by examiner

*Primary Examiner*—Drew A Dunn
*Assistant Examiner*—Stephen J Cherry
(74) *Attorney, Agent, or Firm*—Heslin Rothenberg Farley & Mesiti P.C.

(57) ABSTRACT

A method is provided for calibration of a vectorial network analyzer, having n measurement ports (n>1) and at least m measurement sites with n+1<m<2n. Calibration includes measurement of three different n-port reflection standards connected between the measurement ports in any sequence, and measurement of different transmission standards connected between two measurement ports, and mathematical determination of the error coefficients of the network analyzer and the error-corrected scattering matrices $[S_x]$ of the n-port calibration standards. The reflection standards, similar to shorts and opens, are unknown and the reflection standard implemented by wave terminations is known, but can be different at each n-fold one-port. The measurement of the transmission standards occurs on a transmission standard known in length and attenuation, which is implemented on each possible two-port by different combination of measurement ports. The unknown reflection values of the n-fold one-ports are determined mathematically by the measurements.

7 Claims, 2 Drawing Sheets

Figure 1A:
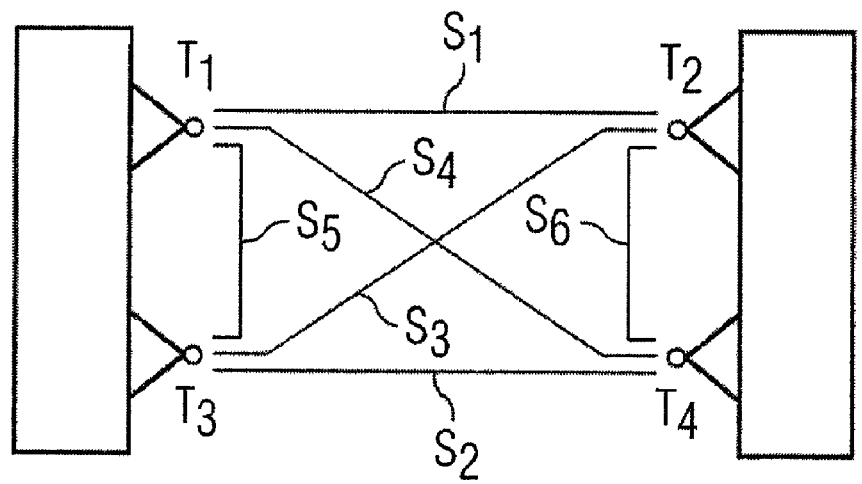

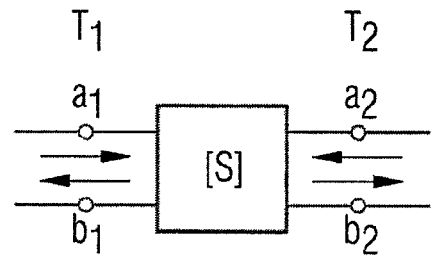
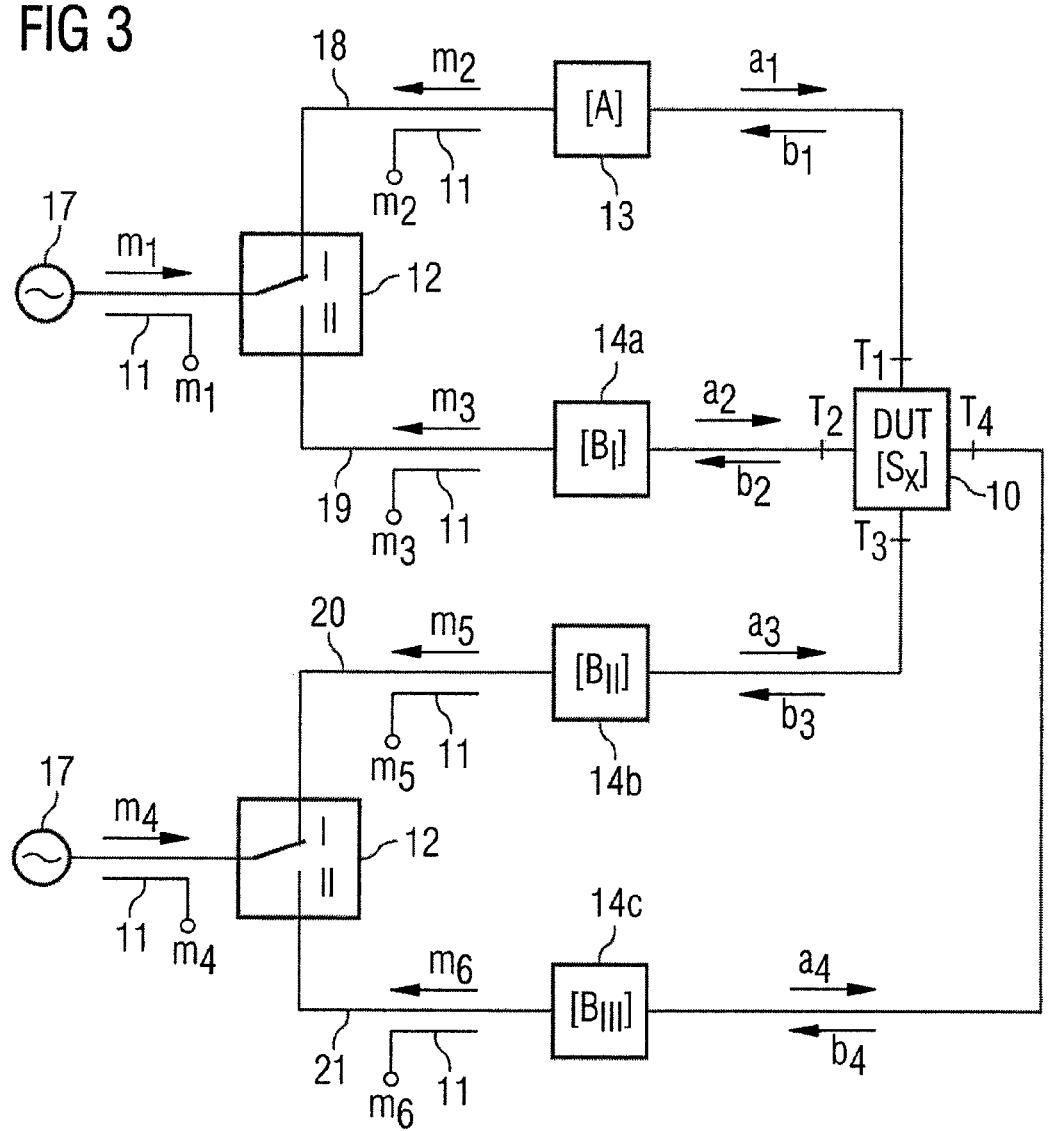

METHOD FOR CALIBRATION OF A VECTORIAL NETWORK ANALYZER

CROSS REFERENCE TO RELATED APPLICATIONS

This application claims priority of German Application No. 10 2006 056 191.0 filed on Nov. 27, 2006, which application is hereby incorporated by reference herein, in its entirety.

BACKGROUND ART

The invention concerns a method for calibration of a vectorial network analyzer having n measurement ports and m measurement sites (n>1) by consecutive measurement of reflection and transmission parameters at different two-port calibration standards connected between the measurement ports in any sequence, all of which must have a transmission path, and three different n-port calibration standards connected between the measurement ports in any sequence that must have no transmission.

Vectorial network analyzers (VNA) are used for precise measurement of electronic components, as well as active and passive high-frequency circuits and high-frequency assemblies up to antennas.

The form of description of electrical behavior of electronic components, common in high-frequency technology, occurs via their scatter parameters (also S-parameters). They do not link the currents and voltages to each other, but wave quantities. This representation is particularly adapted to the physical circumstances. The so-called scatter parameters of n-ports (n=1, 2, . . . ) are detected, which are optionally converted to 2n-pole parameters (for example, Z- or Y-parameters).

For the waves $a_1$ and $a_2$ reaching, for example, a two-port and the waves $b_1$ and $b_2$ propagating accordingly in the opposite direction, the following relation applies:

$$\begin{pmatrix} b_1 \\ b_2 \end{pmatrix} = \underbrace{\begin{pmatrix} S_{11} & S_{12} \\ S_{21} & S_{22} \end{pmatrix}}_{=[S]} \begin{pmatrix} a_1 \\ a_2 \end{pmatrix},$$

in which [S] is the scattering matrix, which characterizes the electronic properties of the two-port.

A so-called system error correction ensures that precise measurements of the scatter parameters of the components can be carried out with vectorial network analyzers at all. This system error correction requires precise measurement of standards whose electronic behavior is known or can be determined in the context of system error correction.

It is known for this purpose to measure the reflection and/or transmission behavior of unknown or partially or fully known calibration standards within the so-called calibration range at several measurement sites to be optimized with respect to position and number.

From the measured values of the calibration standard, correction data are obtained via special calculation methods, so-called error quantities or coefficients. With these correction data and a corresponding correction calculation, measured values are obtained for each arbitrary measured object that is freed of the system errors of the vectorial network analyzer and the feed lines, for example, from couplings (crosstalk) or mismatches (reflections).

A known calibration method for a two-port model with 10 or 12 error quantities is the so-called ten-term or 12-term method. In the American literature, it is also referred to as SOLT (S: short, O: open, L: load=match, T: thru) and in Europe as TMSO. It is the only system calibration method for two-port network analyzers with only three measurement sites, one measurement site on the measurement channel common for both ports in front of the switch, each of which switches one of the ports for measurement, and another measurement site on the measurement channel of each port. In this arrangement of measurement sites, however, the switch is integrated in the measurement of the calibration standards.

In this TMSO calibration method, used most often in practice, the two measurement ports must initially be connected to determine the correction data, which corresponds to the calibration standard T (T=thru). Three known one-ports, for example, the calibration standards match (M), short (S) and open (O), must then be contacted at each measurement port and measured.

The multiport measurement problem consists of the fact that all measurement ports are coupled to each other via the measurement object. Consequently, a dimension of the outgoing wave at one measurement site, a dimension for the reflected wave at the next site, and finally a dimension for the transmitted wave at another site, which is independent of the terminations of the multiport, are no longer obtained, but one must additionally consider the reflection properties of the other measurement ports in the model.

For this multiport measurement problem, in recent years some solutions have been published and patented. The solution to the multiport measurement problem of Ferrero, described in Ferrero, Pisani, Kerwin, "A New Implementation of a Multiport Automatic Network Analyzer," IEEE Trans. Microwave Theory Techn., Vol. 40, November 1992, pages 2078-2085, requires a network analyzer with 2n measurement sites with the same demand for calibration standards as the TMSO method. As a result, the requirements on the hardware of the calibration standards are very demanding. In addition, in the method of Ferrero, all calibration standards must be fully known, which is a particular drawback, since completely known standards cannot be perfectly achieved. In addition, the Ferrero method is exclusively based on the seven-term principle, which results in significant measurement errors, because of the inadequate achievability of fully known standards, and because of the sensitivity of the seven-term principle to such model errors, as explained in Heuermann, "Reliable Methods for Calibration of Network Analyzers for Coaxial and Planar Line Systems," dissertation, Institute of High-Frequency Technology, Ruhr University Bochum, 1995, ISBN 3-8265-1495-5.

A ten-term method is described in DE 199 18 697 A1, which, like the TMSO method, requires only n+1 measurement sites, but exclusively known calibration standards.

The multiport seven-term method, as described in DE 199 18 960 A1, based on an adaptation of the known two-port method to a multiport method, therefore includes the methods TAN, TNA, LAN, TRL, TLR, LLR, LRL, TAR, TMR, TRM, TMS, LMS, TMO, LMO, UMSO, TMN, LNN, TZU, TZY, TYU, LZY, ZZU, YYU, QSOLT and generally require n−1+2 calibration measurements.

Another method of the ATN Company is described in the American patent U.S. Pat. No. 5,578,932. This patent describes, in detail, a so-called test set, with which a two-port network analyzer can be expanded to n ports. In addition, a special calibration device is described, which is required for automatic calibration of this test set.

The calibration device contains, in addition to the standards open, short and match (also termination), an arrangement of different transmission lines that can be connected between the terminals of the calibration device via semiconductor switches. All standards must therefore be fully known, as in the TMSO method. In contrast to the statement in the abstract, however, complete multiport calibration and error correction does not occur.

Instead of this, only two-port paths are calibrated; the remaining ports are not considered (column 18, line 57). In later measurement operation, two-port measurements are carried out in succession. The measurement ports not included in the calibration are then terminated by different reflection standards incorporated within the test sets. For each value of the reflection standard, a two-port measurement is precisely carried out (column 21, line 1). After measurements have been performed on all measurement ports, a result corrected by the systematic error can be calculated from the obtained measured values and the known values of the reflection standards. For measurement of a three-port test object, according to the patent, two two-port measurements from port 1 to port 2 and from port 1 to port 3 are necessary (column 21, line 1 and line 45), in which, for complete characterization of all parameters, the third port of the test object not included must be terminated during measurement from port 1 to port 2 by at least three different reflection standards (column 21, line 28). This means that, for complete characterization of a three-port 3+1=4, two-port measurements are necessary.

A so-called RRMT calibration method is described in DE 10 204 020 037 A1, in which, in contrast to the method just mentioned, not all calibration standards need be known. From transmission standards known with respect to length and attenuation, the reflection behavior of n known impedances, which are achieved on the one-ports, but can be different in comparison with each other, and from n unknown, strongly reflecting standards open and short, the scatter parameters of the unknown calibration standards open and short are initially determined by calibration, in order to determine the error coefficients of the network analyzer with the ten known terms.

However, a problem in each case is that the measurement of electronic components in the wafer structure (on-wafer measurements) is subject to special boundary conditions, especially with respect to attainability of the calibration standards.

In the semiconductor field, it is not uncommon for the user to implement the calibration standards on the wafers themselves. The geometric reproducibility and equality of calibration standards produced in this way is very high. It is then also advantageous that the calibration standards are situated on the same substrate support (semiconductor) as the measurement objects. In addition to the advantages of short travel paths, parasitic elements, as well as transitional effects from the measurement tips to the wafer, can also be "calibrated out." However, the electronic properties are only achieved in good approximation. In particular, the reflection standard open cannot be produced with the necessary quality.

The reflection standards (R) can be described very precisely on semiconductors, but generally vary sharply with respect to DC resistance values. In the described methods according to the prior art, it is necessary that R-standards be connected on each measurement port with the most identical possible reflection behavior. If this cannot be guaranteed, as is the case in multiport-on-wafer measurements, since standards are regularly arranged at 90° angles to each other, so-called strains occur, which are regularly the source of very large measurement errors.

Another problem is the number of measurement sites, which must be optimized, in particular in automatic measurements, in order to save equipment demands and costs and achieve reproducible measurement results. Here, the deficient attainability of calibration standards with known properties on the wafer level stand in contrast to the requirement for minimization of measurement sites. On the one hand, the use of unknown standards requires the application of the seven-term method in order to determine the scatter parameters of these standards. On the other hand, the seven-term method, because of the aforementioned vulnerability to errors, is suitable for use of only n+1 measurement sites, in which, on each feed line to a port, an additional measurement site is arranged in front of the switch for switching of the corresponding port.

SUMMARY OF THE INVENTION

The underlying task of the invention is therefore to provide a method for calibration of network analyzers, which have n measurement ports and are used for multiport measurement on semiconductor wafers, with which optimization of the number of measurement sites, during largely reproducible calibration, is possible with improved measurement accuracy, also using not fully known calibration standards implemented on the user side.

The described methods are characterized by the fact that, depending on the known and unknown calibration standards corresponding to the employed method and the requirements on measurement quality, the number of measurement sites can be smaller than 2n, for example, on selected measurement lines, instead of two, only one measurement site can be set up or the switch is included for individual calibration measurements, as is known of the network analyzers with n+1 measurement sites. At the same time, in customary fashion, in addition to the n impedance standards, which are measured on the n-fold one-port (n-one-port), two reflection standards (R), shorts and opens, are similarly measured. The methods therefore offer the same advantages as the RRMT methods with a reduction in measurement sites, namely that the calibration standards need not be exactly known. Consequently, with these methods and calibration standards produced by users themselves, multiport measurements can be conducted with very high precision and very low costs for the calibration standards. All described methods are characterized by the following uniqueness criteria of the calibration standards:

1.: The phase of the reflection standard (R) must only be known to ±90°. More information is not necessary. In practice, a real short and an open are used. The deviations, relative to an ideal short or open, have no effect on the measurement accuracy.

2.: The impedance standards (M) must be fully known. However, these can be different in the RRMT method. Such standards are often referred to as transfer-match.

3.: The line standard (T) in the RRMT methods according to claims 1 and 2, and also (L) in the LRRM methods according to claims 3 and 4, must be fully known, but can exhibit a finite attenuation, and optionally a known reflection behavior. Different line standards can also be used between different measurement ports.

The use of the ten-term method for determination of the error coefficients of the measured two-port calibration standards and the scattering matrix proves to be advantageous in conjunction with the additional features of the method, since the ten-term method reacts insensitively to model errors.

Based on calibration measurements of the n impedance standards on an n-one-port, an advantage of the method lies in the fact that the measurement accuracy, relative to the prior art, is significantly increased. Deviations, relative to the measured reference port at the so-called adaptation point ($S_{11}=0$), in which the properties of the M-standard are only "calculated over" to the other measurement points, are avoided in this way. The additional n−1 measurements, required for measurement on a one-port, are not a shortcoming in the on-wafer measurements, since they occur fully automatically in a significant part, and these costs consequently only account for a fraction of the costs of the overall system, and since they provide additional information to increase the quality of the calibration method.

In addition, the RRMT method, like the methods according to claims 2 to 4, is characterized by the fact that they always use lines for connections of the measurement ports. This corresponds to the special conditions of on-wafer measurements, where, in contrast to coaxial measurements, the measurement ports (on-wafer measurement tips or probes) cannot be directly connected and therefore a true thru standard can never be used.

Ordinary deviations that cannot be avoided at known DC resistance values of impedance standards present on semiconductors do not influence the method of this invention, on the other hand.

The described methods function relative to the known methods, especially those using network analyzers with n+1 measurement sites, much more precisely and with more long-term stability, because in these methods, drift effects of the electronic switches have no effect on measurement quality.

The methods according to claim 2 and the claims referred to it also permit the use of reflection standards that need not be exactly known. Since the impedance standards are also measured on the n-one-port, these methods also permit calibration measurements with high measurement accuracy.

Since this calibration method, however, uses the seven-term method for calculation of the error coefficients and the scattering matrix, so that the calculation expense is reduced and the thru standard is measured between a reference point and the other n−1 ports, instead of between all measurement port combinations, these methods are used, in particular, in multiport measurements with n>2. They are referred to below as multiport RRMT method or GRRMT method. The higher sensitivity of the seven-term method, relative to model errors, has only a slight effect, since the impedance measurement on the n-one-port occurs and no over-calculation is required, and since it represents an optimization of the calculation expense for these multiports. The described circuit and measurement advantages of the RRMT method is also characteristic of the multiport RRMT method.

For multiport measurements with n>2, as an alternative to the RRMT and GRRMT methods, it is also possible that the additional calibration measurement is conducted on a one-port, implemented by means of a known impedance (for example, so-called wave terminations with 50Ω, M=match) instead of on an n-one-port, implemented by means of n known impedances, and the properties of this impedance are determined by calculation on the other n−1 one-ports from this calibration measurement. These embodiments of the invention are referred to below as LRRM and GLRRM or multiport LRRM methods. In these two methods, optimization again occurs between the calculation and circuit and measurement expense for the multiports with reference to the required measurement accuracy.

The four methods that are described below under claims 1 to 4 differ during performance by individual features, which, however, can have a significant effect, in practice. The greatest difference is found between the RRMT methods according to claims 1 and 2 and the multiport LRRM methods under claims 3 and 4. In the multiport LRRM methods, only an impedance standard is contacted and measured on a port, this port serving as reference port. On the other hand, in the RRMT methods, an impedance standard that need not be equal to any other impedance standard is contacted and measured on each port.

The difference between the RRMT and the multiport LRRM methods lies in the number of T- and L-measurements. In the methods according to claims 1 and 3, k measurements are required and therefore more than in the methods according to claims 2 and 4, where only n−1 measurements are required. The methods according to claims 1 and 3 are again characterized by greater robustness. For example, it can be demonstrated that the transmission dynamics in methods 1 and 3 corresponds to that of the device, and they are used wherever the measurement dynamics of the network analyzer is to be achieved. On the other hand, in the methods of claims 2 and 4, there is distinctly greater sensitivity with respect to smaller contacting errors and incompleteness in the calibration standards. Consequently, the methods according to 2 and 4 are only used when the number n of measurement ports is incomparably large.

With such limited demands on calibration standards, the described multiport calibration methods can also be used for automated calibrations of vectorial network analyzers in coaxial environments. For two-port calibrations, algorithms and corresponding switching networks are already marketed by several manufacturers. In multiport calibrations, the number of contact errors of the calibration standards is much larger, which costs time and money and conceals larger risks of error.

The reflection standards open and short are particularly suitable for implementing physically equivalent calibration standards on the individual ports, so that the terms required by the unknown through connections for determination of the scatter parameters can also be obtained from this boundary condition of the method. It is therefore possible to draw conclusions from the measurement of one of the reflection standards concerning the electronic properties of the physically equivalent standard on the other port.

Figure 1B:
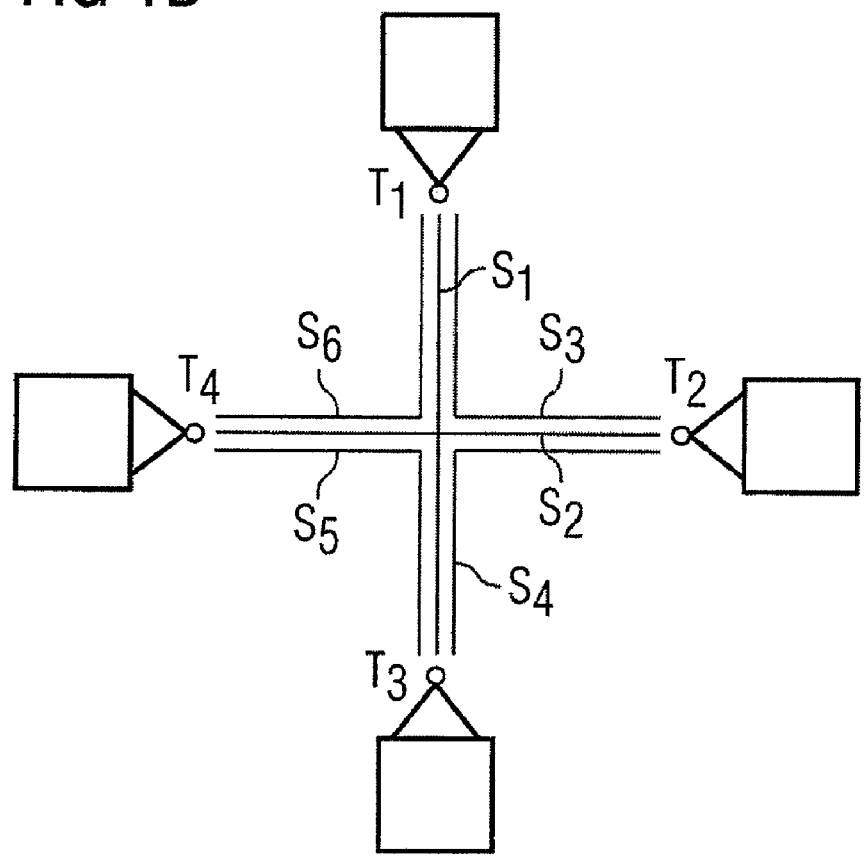

Comparable advantages are obtained if the transmission standards behave symmetrically relative to each other. With reference to FIG. 1*a*, for example, the standards $S_5$ and $S_6$ and, in FIG. 1*b*, the standards $S_4$ and $S_5$, can be configured symmetric to each other. By means of the information gained in this way, it is possible, for example, to produce a smaller number of transmission standards, the n−1 standards between a reference port and the other ports, which is an advantage in the cases mentioned in the introduction on the wafer level.

BRIEF DESCRIPTION OF THE DRAWING FIGURES

The invention will be further explained below by means of a practical example. The corresponding drawing shows, in FIG. 1*a* and 1*b* the schematic representations of six transmission standards of a four-port, each implemented differently on a wafer, FIG. 2 the schematic definition of a scattering matrix, the incoming and outgoing wave on the two-port, and FIG. 3 a block diagram of a vectorial 4-port network analyzer.

FIG. 2 shows a two-port, which is characterized by its scattering matrix [S]. The waves $a_1$ and $a_2$ are waves arriving at the two-port, and $b_1$ and $b_2$ are waves propagating accordingly in the opposite direction. The following relation applies $$\begin{pmatrix} b_1 \\ b_2 \end{pmatrix} = \underbrace{\begin{pmatrix} S_{11} & S_{12} \\ S_{21} & S_{22} \end{pmatrix}}_{=[S]} \begin{pmatrix} a_1 \\ a_2 \end{pmatrix}.$$

An n-port can be represented in the same way with waves $a_1$ to $a_n$, $b_1$ to $b_n$, and the characterizing scattering matrix [S]. The case of a 4-port network analysis system, i.e., n=4, is illustrated as a block diagram in FIG. 3. It is apparent that n+2=6 measurement sites 11 are necessary. FIG. 3 shows how such a layout is to be implemented and serves as a basis for the following description of the multiport methods.

DETAIL DESCRIPTION

It is shown in FIG. 3 how the signal of one of two sources 17 is guided via a first switch 12 to the branches 18 and 19 and the signal of a second source 17 is guided by a second switch 12 to the branches 20 and 21. Both switches 12 are arranged in front of measurement sites 11 for the return waves in the corresponding branches 18, 19, 20, 21, here designated as a $m_2$ and $m_3$, as well as $m_5$ and $m_6$. Between each source 17 and a switch, two additional measurement sites 11 are arranged, designated as $m_1$ and $m_4$, which record the dimension for the outgoing waves. The measurement sites 11, assumed to be ideal, are therefore, viewed in the propagation direction of the wave being measured, always arranged in front of a switch 12 and, in each case, record a dimension for the outgoing and transmitted wave. The properties of switch 12, for example, reproducibility, reflection and long-term stability, are considered in the following calculation by means of the ten-term model. All deterministic non-idealities and incompletenesses in the form of mismatches and crosstalk are combined and considered in the error matrices 13, 14a, 14b and 14c. The measurement object 10 (DUT) is connected at ports $T_1$, $T_2$, $T_3$ and $T_4$ to the vectorial network analyzer via the corresponding switch position.

In each switch position, at two measurement sites, the measurement values $m_n$ for the reflection or the transmission behavior of the implemented calibration standards are recorded. For the method according to claim 1, the six transmission standards of known length and attenuation are connected between ports $T_1$ and $T_2$, $T_3$ and $T_1$, $T_4$ and $T_1$, $T_3$ and $T_2$, $T_2$ and $T_4$, as well as $T_3$ and $T_4$. In addition, the n-fold match standards, as well as reflection standards, shorts and opens, are similarly designated at each one-port as an n-one-port. If one of the other methods is used, the measured values $m_n$ are measured according to the features described for it, in which, in the methods according to claim 2, one of the ports is defined as reference port, and the two ports are formed by this reference port and each of the other ports. As described below, the scattering matrix is determined from these measured values.

The described methods can be divided mathematically into three steps:

1. So-called self-calibration of the unknown reflection standards,
2. So-called direct calibration, and
3. System error correction.

In the first step, the unknown parameters are calculated in the calibration standards. Channel and determinant properties of the imaging matrices are utilized here, as described in Heuermann, "Reliable Methods for Calibration of Network Analyzers for Coaxial and Planar Line Systems," dissertation, Institute of High-frequency Technology, Ruhr University Bochum, 1995, ISBN 3-8265-1495-5. The match calibration standards are not considered with ideal properties (S 11=0) in mathematics. This means that the equations resulting from them for calculation of the reflection values of the two R-standards are distinctly longer. However, these equations do not differ relative to the aforementioned uniqueness criteria for the line, impedance and reflection standards from the ordinary solutions of self-calibration calculations.

In the second step of direct calibration, the error coefficients are calculated. This occurs for the RRMT method according to claim 1 and for the LRRM method according to claim 3 in the conventional ways of the ten-term methods, as were described in Schick, "Measurement Systems of High-frequency Technology," Hüthig-Verlag, Heidelberg, 1984, and in Heuermann, "Reliable Methods for Calibration of Network Analyzers for Coaxial and Planar Line Systems," dissertation, Institute of High-frequency Technology, Ruhr University Bochum, 1995, ISBN 3-8265-1495-5. For each through connection, a two-port calibration is carried out and the error coefficients for this connection are known. The way for treatment of the multiport method is then described as a third step.

For the methods according to claims 2 and 4, routes of the seven-term method for calculation of error coefficients are also described in Heuermann, "Reliable Methods for Calibration of Network Analyzers for Coaxial and Planar Line Systems," dissertation, Institute of High-frequency Technology, Ruhr University Bochum, 1995, ISBN 3-8265-1495-5 for similar two-port methods. The combining of these results of the two port methods into a multiport method is also shown in the next step.

In the third step for performance of a system error correction, the measured data of an unknown measured object are corrected from the errors of the vectorial network analyzer and the feed lines.

For the methods according to claim 1, which are based on the ten-term principle, the output basis for the mathematical description of the ten-term multiport method forms the above-described error model. In the interest of simplicity, the mathematical derivation is only made here for the case of measurement of three-ports. By a corresponding switch position I, II and III, a source signal is switched to the branch of the corresponding port. Generalization of this procedure to n-ports is possible in simple fashion.

To determine the conventional error matrices of the ten-term model, a two-port calibration is carried out between each of the three possible measurement port combinations with the corresponding error matrices [A], [F] and [G]. The following applies: $[F]=[B_I]^{-1}$ and $[G]=[B_{II}]^{-1}$.

For a first switch position I, the error matrix [A] is the reference port, which contains three error quantities, for II, [F] is the reference port and for III, [G]. The two other measurement ports for each switch position contain only the two error quantities (for example, $F_T$, $F_L$) of the transmission error network. The corresponding quantities should be singly, doubly and triply deleted subsequently as a function of the switch position. For the case of a three-port, 3*3+3*2*2=21 error quantities are therefore obtained.

The correction calculation of the measured values of the measured object (mi) can be set up as follows, using the 21 error quantities:

$$\begin{pmatrix} m'_2 \\ a'_1 \end{pmatrix} = [A'] * \begin{pmatrix} m'_1 \\ b'_1 \end{pmatrix}, \quad (2)$$

$$b'_2 = m'_4 / F'_T,$$

$$a'_2 = F'_1 * b'_2, \quad (3)$$
$$b'_3 = m'_6 / G'_T,$$
$$a'_3 = G'_T * b'_3.$$

After rearrangement, six equations are obtained for the six wave quantities $a'_1$, $a'_2$, $a'_3$, $b'_1$, $b'_2$, $b'_3$.

The procedure is the same for the other switch positions. These 3*6 equations can be inserted in the equation $$\begin{pmatrix} b_1 \\ b_2 \\ b_3 \end{pmatrix} = [Sx] \begin{pmatrix} a_1 \\ a_2 \\ a_3 \end{pmatrix} \quad (4)$$

For each switch position, the values of a matrix column are obtained, which ultimately leads to a linear system of equations, consisting of two n*n measured value matrices and the n*n scattering matrix. If this system of equations is solved according to the $[S_x]$ matrix, the error-corrected scatter parameters of an n-port are available.

For the methods according to claims 2 and 4, which are based on the seven-term principle, the output basis for the mathematical description of the seven-term multiport method also forms the same error model. In the interest of simplicity, the mathematical derivation is only carried out either for the case of measurement of three-ports. The generalization of this procedure to n-ports can again be conducted simply by providing a switch with n output ports and considering additional measurement sites for each additional port of the measured object.

To determine the conventional error matrices of the seven-term model, a two-port calibration is carried out between the reference port with the error matrix [A] and the error matrices $[B_i]$ (i=1, 2, . . . , n). The designation seven-term model is based on the fact that the corresponding 2*2 error matrices [A] and $[B_i]$ contain a total of seven error terms, since one of the eight contained quantities can always be set to 1.

It is also advantageous to setup the mathematical formulation of the two-port model in the inverse form of the stated transmission parameters:

$$[G]=[A]^{-1}, [H_i]=[B_i]^{-1}, i=1,2 \quad (2)$$

in which the following applies for the inputs and outputs on the error networks $$\begin{pmatrix} b_1 \\ a_1 \end{pmatrix} = [G] * \begin{pmatrix} m_1 \\ m_2 \end{pmatrix}, \begin{pmatrix} a_i \\ b_i \end{pmatrix} = [H_i] * \begin{pmatrix} m_{2i-1} \\ m_{2i} \end{pmatrix} \quad (3)$$

These equations can be solved according to the $a_1$ and $b_1$ wave quantities and inserted in the equation $$\begin{pmatrix} b_1 \\ b_2 \\ b_3 \end{pmatrix} = [Sx] \begin{pmatrix} a_1 \\ a_2 \\ a_3 \end{pmatrix} \quad (4)$$

For each switch position, the values of a matrix column are obtained, which ultimately lead to a linear system of equations, consisting of two n*n measured value matrices and the n*n scattering matrix. If this system of equations is solved according to the $[S_x]$ matrix, the error-corrected scatter parameters of an n-port are available.

The invention claimed is:

1. Method for calibration of a vectorial network analyzer, having n measurement ports for n>1 and m measurement sites, in which, n+1<m<2n, by consecutive measurement of reflection and transmission parameters at k=sum (n−i) for (i=1, 2, . . . , n−1) different, two-port calibration standards connected between the measurement ports in any sequence, all of which must have a transmission path, and three different additional n-port calibration standards connected between the measurement ports in any sequence, which may have no transmission, by mathematical determination of error coefficients of the network analyzer by means of ten-term methods in a k-fold application, using the measured two-port calibration standards and by mathematical determination of error-corrected scattering matrices $[S_x]$ of the n-port calibration standards from the error coefficients of each two-port calibration standard, with consideration of transmission error quantities of other n−2 measurement ports by means of ten-term multiport methods, in which
   (a) said k calibration measurements are conducted on a two-port, which is implemented by means of direct connection of the measurement ports (through connection, T=thru) or a short adapted line (L=line) of known length and attenuation, and which is connected between each k possible measurement port combination,
   (b) one of said additional calibration measurements is carried out on an n-fold one-port (n-one-port), which is implemented by means of n known impedances, in which the n known impedances can be different in comparison with each other,
   (c) one of said additional calibration measurements is conducted on an n-one-port, which is implemented by means of n unknown, strongly reflecting terminations (R=reflect), whose electrical properties are similar to those of shorts (S=short),
   (d) one of said additional calibration measurements is conducted on an n-one-port, which is implemented by means of n unknown, strongly reflecting terminations (R=reflect) whose electrical properties are similar to those of opens (O=open), and
   (e) the reflection values of the n-one-ports, which are implemented by unknown reflecting terminations, similar to shorts or opens, are determined mathematically.

2. Method for calibration of a network analyzer according to claim 1, in which
   (a) n>2 applies,
   (b) the said additional calibration measurement is carried out, instead of on an n-one-port implemented by means of n known impedances, on a one-port, which is implemented by means of a known impedance and
   (c) the properties of the known impedance on the other n−1 one-ports are determined mathematically from the calibration measurement of the known impedance on the one-port.

3. Method for calibration of a network analyzer according to claim 1, in which, for n>2, the said additional calibration measurement is conducted, instead of on an n-one-port, implemented by means of n known impedances, on an (n−i) one-port, in which i<n, which is implemented by means of a known impedance or several known impedances, and the properties of the known impedances on the other i one-ports are determined mathematically from the calibration measurement of the known impedances on the (n−i) one-ports.

4. Method for calibration of a network analyzer according to claim 1, in which electrical properties of one of the strongly reflecting terminations are known.

5. Method for calibration of a network analyzer according to claim 1, in which, for n>3, at least two of the unknown reciprocal through connections are symmetric to each other.

6. Method for calibration of a vectorial network analyzer, having n measurement ports for n>1 and m measurement sites, in which n+1<m<2n, by sequential measurement of reflection and transmission parameters at n−1 different two-port calibration standards connected between the measurement ports in any sequence, which all must have a transmission path, and three different additional n-port calibration standards connected between the measurement ports in any sequence, which must have no transmission, by mathematical determination of error coefficients of the network analyzer by means of seven-term methods in n−1-fold application and measured two-port calibration standards, as well as by mathematical determination of error-corrected matrices $[S_x]$ of the n-port calibration standards by means of seven-term multiport methods, in which (a) said n−1 calibration measurements are conducted on a two-port, which is implemented by means of direct connection of the measurement ports (through connection, T=thru) or a short matched line (L=line) of known length and attenuation, and which is connected between a measurement port established as reference measurement port and the n−1 remaining ports, (b) one of said additional calibration measurements is conducted on an n-one-port, which is implemented by means of n known impedances, in which the n known impedances can be different in comparison with each other, (c) one of said additional calibration measurements is conducted on an n-one-port, which is implemented by means of n unknown, strongly reflecting terminations (R=reflect), whose electrical properties are similar to those of shorts (S=short), (d) one of said additional calibration measurements is conducted on an n-one-port, which is implemented by means of n unknown, strongly reflecting terminations (R=reflect), whose electrical properties are similar to those of opens (O=open), the reflection values of the n-one-ports, which are implemented by unknown reflecting terminations similar to shorts or opens, are determined mathematically.

7. Method for calibration of a network analyzer according to claim 6, in which (a) n>2 applies, (b) the said additional calibration measurement is conducted, instead of on an n-one-port, implemented by means of n known impedances, on a one-port, which is implemented by means of a known impedance and (c) the properties of the known impedance are determined mathematically on the other n−1 one-ports from the calibration measurement of the known impedance on the one-port.

* * * * *